United States Patent [19]

Busacca et al.

[11] 4,209,755

[45] Jun. 24, 1980

[54] TUNABLE OSCILLATOR COMPRISING DUAL-CAVITY KLYSTRON

[75] Inventors: Guido Busacca; Roberto Burrascano; Vicenzo Meli; Salvatore Migliaccio, all of Palermo, Italy

[73] Assignee: Società Italiana Telecomunicazioni Siemens S.p.A., Milan, Italy

[21] Appl. No.: 929,029

[22] Filed: Jul. 28, 1978

[30] Foreign Application Priority Data

Aug. 1, 1977 [IT] Italy .............................. 26369 A/77

[51] Int. Cl.[2] .......................... H01J 25/14; H03B 9/04

[52] U.S. Cl. ...................................... 331/83; 315/5.43; 315/5.44; 315/5.48

[58] Field of Search ...................... 331/83; 315/5, 5.16, 315/5.43, 5.44, 5.46, 5.48, 5.53, 5.54; 330/45

[56] References Cited

U.S. PATENT DOCUMENTS

| | | | |
|---|---|---|---|
| 2,546,976 | 4/1951 | Clark et al. | 315/5.46 X |
| 3,078,385 | 2/1963 | Sorg et al. | 315/5.54 X |
| 3,488,550 | 1/1970 | Oltman, Jr. | 315/5.44 |

*Primary Examiner*—Siegfried H. Grimm
*Assistant Examiner*—Edward P. Westin
*Attorney, Agent, or Firm*—Karl F. Ross

[57] ABSTRACT

A self-exciting oscillator comprises a klystron with an input cavity and an output cavity, interconnected by a feedback port, which resonate at fractionally different frequencies in the microwave range. The output cavity, alone, is tunable to vary the operating frequency within a range of about ±2%.

4 Claims, 1 Drawing Figure

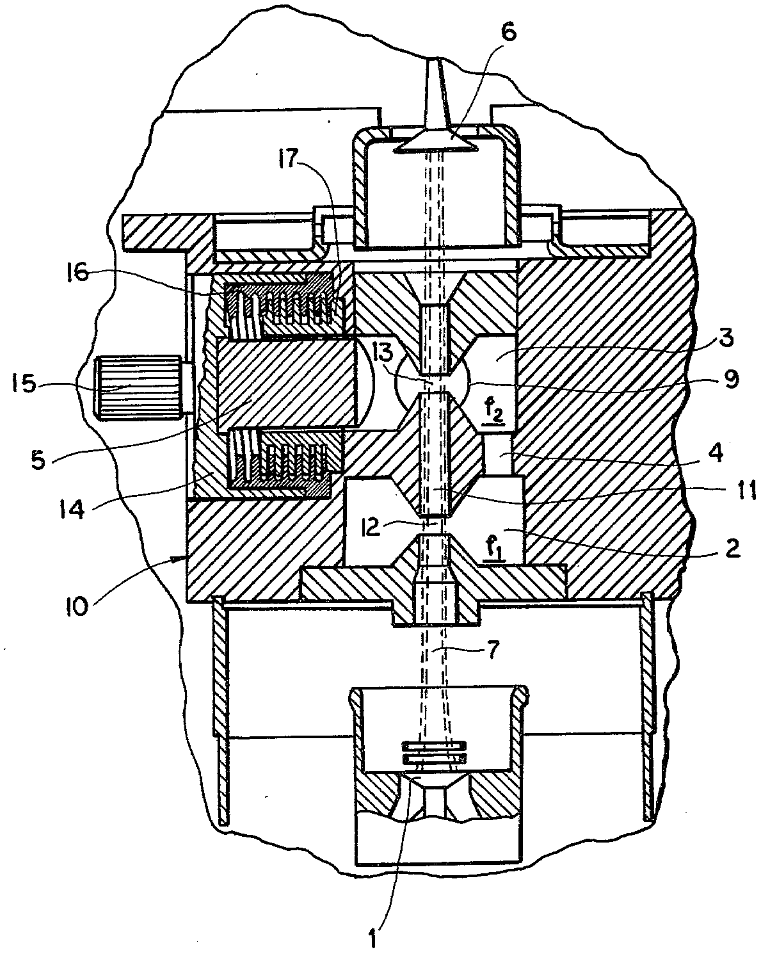
6
17
16
3
13
9
15
f2
5
4
14
11
12
2
f1
10
7
1

TUNABLE OSCILLATOR COMPRISING DUAL-CAVITY KLYSTRON

FIELD OF THE INVENTION

Our present invention relates to a self-exciting oscillator comprising a klystron whose conductive body has a first or input cavity forming a buncher gap and a second or output cavity forming a catcher gap, the two gaps being interconnected by a drift tube in which electrons velocity-modulated by an input voltage across the buncher gap group themselves to induce a corresponding output voltage across the catcher gap. Oscillations are sustained in such a device by a feedback connection regeneratively coupling the two cavities to each other.

BACKGROUND OF THE INVENTION

Conventionally, the two cavities of such a klystron are designed to resonate at the same ultra-high frequency, i.e. the desired operating frequency of the oscillator. To vary this operating frequency, the two cavities must be retuned simultaneously; since the resonance frequency of each cavity is determined by its dimensions, such retuning requires a structural change by a displacement of a piston or the like constituting a mobile wall portion thereof. In view of the high Q of such a resonant cavity, its tuning is a delicate operation; the properly correlated tuning of two cavities by respective pistons is therefore difficult and time-consuming. The use of a single diaphragm common to both cavities, replacing the respective tuning pistons thereof, simplifies the adjustment procedure but affects the intercavity feedback and therefore the amplitude of the driving voltage applied to the buncher gap.

OBJECTS OF THE INVENTION

The general object of our present invention, therefore, is to provide a tunable klystron oscillator of the aforedescribed type which obviates the problems referred to.

A more particular object is to provide an oscillator of this character which, with an operating frequency on the order of 10 GHz, is tunable over a range of about 0.4 GHz.

SUMMARY OF THE INVENTION

We have found, in accordance with our present invention, that these objects can be realized if—contrary to conventional practice—the two cavities are designed to resonate at fractionally different frequencies and if the second or output cavity is provided with tuning means for selectively modifying its resonance frequency, independently of the resonance frequency of the first or input cavity, over a range which is smaller than the difference between the two resonance frequencies at the midpoint of that range. With the regenerative coupling between the cavities feeding back the second or output frequency to the first cavity, oscillations are sustained even with frequency differences on the order of 10% of this second frequency. A deviation of the latter frequency from its mean value up to about ±2% of its magnitude changes such a frequency difference to only a minor extent, and therefore does not significantly alter the feedback factor, in contrast to the conventional situation of zero frequency difference. We have found, in fact, that this feedback factor does not vary by more than ±5% under these circumstances.

When the first frequency (i.e. that of the input cavity) is lower than the second frequency, the intercavity coupling can be conveniently designed to discriminate against that frequency so as not to feed it forward to the output cavity. Thus, the feedback means may be a partition between the two cavities provided with a port which acts as a waveguide for the higher one of these frequencies while rejecting the lower one.

BRIEF DESCRIPTION OF THE DRAWING

The above and other features of our invention will now be described in detail with reference to the accompanying drawing the sole FIGURE of which is a cross-sectional view of our improved klystron oscillator.

SPECIFIC DESCRIPTION

In the drawing we have shown a klystron 10 whose body forms an input cavity 2 having a resonance frequency $f_1$ and an output cavity 3 having a resonance frequency $f_2$, these cavities communicating with each other on the one hand by a drift tube 11 and on the other hand by a feedback port 4. Cavities 2 and 3 respectively form a buncher gap 12 and a catcher gap 13 in line with drift tube 11 as well as with an electron gun 1 and a collector electrode 6 disposed at opposite ends of the klystron body. An electron beam 7 is trained in the usual manner upon collector electrode 6 by way of the two gaps 12, 13 and the drift tube 11, its electrons being velocity-modulated in gap 12 by an ultra-high frequency driving voltage and becoming bunched in drift tube 11 to energize the gap 13, causing the cavity 3 to oscillate at its resonance frequency $f_2$. The driving voltage is sustained by feedback via port 4 which may be a slot of rectangular cross-section constituting a waveguide large enough to pass the waves of frequency $f_2$ but not the somewhat longer waves of frequency $f_1$. The length of drift tube 11, of course, is so chosen that the electron groups created by the driving voltage of the buncher gap 12 arrive at the catcher gap 13 with the proper phasing to sustain the oscillations. The operating frequency $f_2$ is delivered to a nonillustrated load by way of an output waveguide 9.

To vary this operating frequency within a range of about ±2% of its mean value, a tuning piston 5 is limitedly displaceable in a direction transverse to the common axis of the toroidal cavities 2 and 3 (along which the beam 7 passes) as is well known per se. Piston 5 is shown seated in a cup 14 provided with a knob 15 for manual rotation although, of course, a mechanical tuning drive could also be used. Cup 14 carries an internally threaded ring 16 meshing with complementary external threads on a sleeve 17 rigid with the klystron body. Piston 5 could be replaced by a diaphragm or by any other conventional tuning means such as, for example, an insulator of electrically variable dielectric constant inserted into cavity 3.

By way of example, frequencies $f_1$ and $f_2$ may be 8.5 GHz and 9.5 GHz, respectively, the latter frequency being variable by ±0.2 GHz with the aid of tuning means 5.

We claim:

1. A self-exciting oscillator comprising:

a klystron having a conductive body with a first cavity resonant at a first ultra-high frequency and a second cavity resonant at a second ultra-high frequency fractionally higher than said first frequency, said cavities being interconnected by a drift tube in line with a buncher gap formed by said first cavity and a catcher gap formed by said second cavity;

an electron gun disposed at one end of said body for emitting an electron beam successively traversing said buncher gap, drift tube and catcher gap;

a collector electrode disposed at an opposite end of said body for intercepting said beam;

feedback means regeneratively coupling said second cavity to said first cavity for transmitting said second frequency thereto, said feedback means being dimensioned to discriminate against said first frequency for suppressing transmission thereof to said second cavity;

tuning means at said second cavity for selectively modifying said second frequency independently of said first frequency within a limited range of adjustment smaller than the difference between said frequencies at the center of said range of adjustment; and output means coupled to said second cavity.

2. An oscillator as defined in claim 1 wherein said difference is substantially 10% of said second frequency, said range of adjustment encompassing substantially 4% of said second frequency.

3. An oscillator as defined in claim 1 wherein said feedback means comprises a partition between said cavities provided with a port for the passage of microwaves at said second frequency.

4. An oscillator as defined in claim 3 wherein said port is a waveguide passing said second frequency to the exclusion of said first frequency.

* * * * *